United States Patent [19]

Stineman, Jr.

[11] Patent Number: 4,794,247

[45] Date of Patent: Dec. 27, 1988

[54] READ-OUT AMPLIFIER FOR PHOTOVOLTAIC DETECTOR

[75] Inventor: John A. Stineman, Jr., Goleta, Calif.

[73] Assignee: Santa Barbara Research Center, Goleta, Calif.

[21] Appl. No.: 98,155

[22] Filed: Sep. 18, 1987

[51] Int. Cl.[4] .............................................. H01J 40/14
[52] U.S. Cl. .................................. 250/214 A; 307/490
[58] Field of Search ....... 250/214 A, 214 R, 214 SW; 307/352, 353, 311, 228, 490, 508; 328/150, 151, 128, 122

[56] References Cited

U.S. PATENT DOCUMENTS

| | | | |
|---|---|---|---|
| 3,636,458 | 1/1972 | Sugiyama et al. | 328/151 |
| 4,313,067 | 1/1982 | White | 307/311 |
| 4,439,693 | 3/1984 | Lucas et al. | 328/128 |
| 4,578,646 | 3/1986 | Maio et al. | 307/128 |

Primary Examiner—David C. Nelms
Assistant Examiner—Stephone B. Allen
Attorney, Agent, or Firm—W. C. Schubert; V. G. Laslo; Karambelas A. W.

[57] ABSTRACT

A read-out amplifier (200) for a photovoltaic detector (201) employs an integrating amplifier (203) with capacitor feedback (230) during a self-calibrating active load (205, 240) to minimize debiasing of the photovoltaic detector during its operation. The self-calibrating active load reduces the effect of noise and threshold nonuniformities of the semiconductor devices (202, 203, 204, 205) used in the read-out amplifier circuitry.

10 Claims, 1 Drawing Sheet

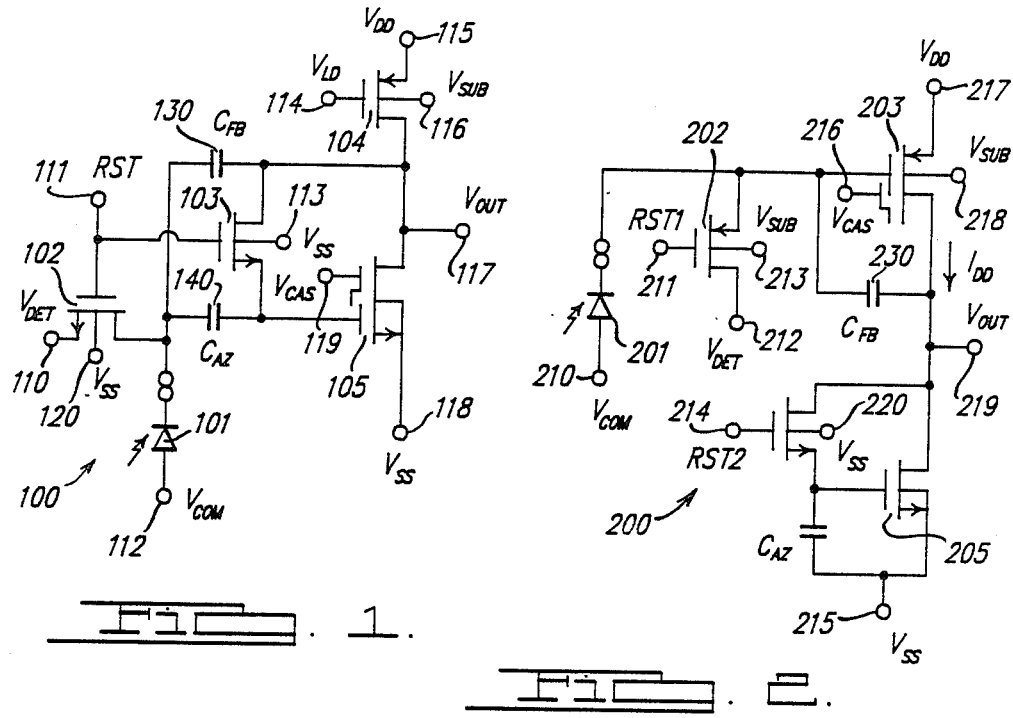
FIG. 1.
FIG. 2.
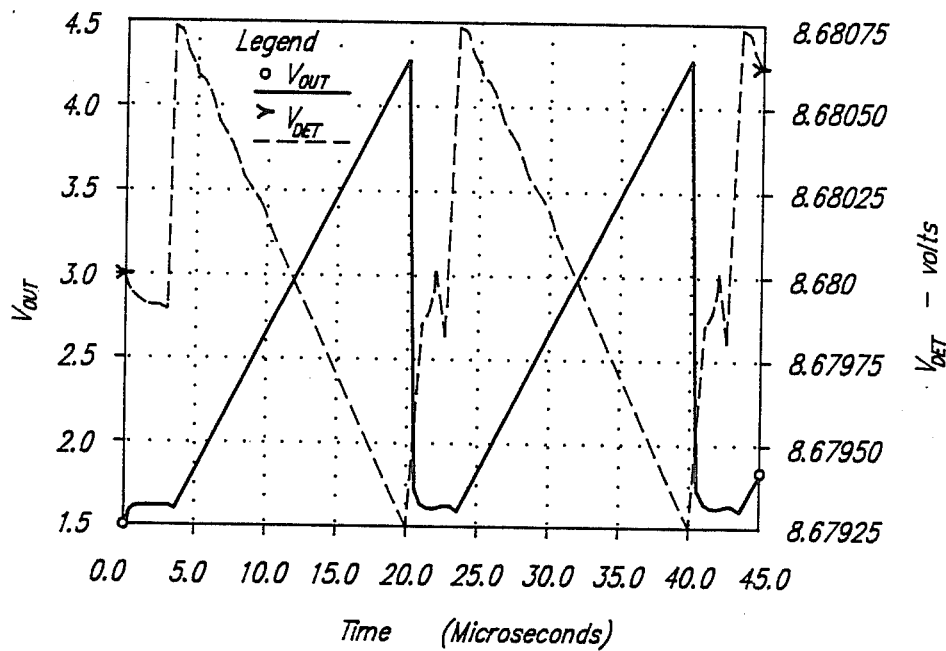
FIG. 3.

READ-OUT AMPLIFIER FOR PHOTOVOLTAIC DETECTOR

BACKGROUND OF THE INVENTION

The invention relates generally to apparatus for generating suitable output signals in accordance with signals generated by photovoltaic devices. More specifically, the invention concerns amplifiers for processing signals generated by photovoltaic detectors and supplying the processed signals as outputs to suitable utilization devices.

Focal plane arrays of infrared detecting photovoltaic devices, such as diodes, are used for imaging objects which emit infrared radiation. For example, suitable infrared emitting objects would be relatively warm and could be targets to be acquired by heat seeking weapon systems. Each photovoltaic detector in such an array serves as a picture element or "pixel" and read-out apparatus associated with each pixel is required to integrate the current generated by photons impinging on the infrared photovoltaic device. Integration of the acquired optical signal is desired to minimize target signal noise and to enable acquisition of randomly arriving photons at the detector device.

To convert the integrated photovoltaic detector current to an output voltage for use by a processing device, it has been known to couple the detector output to a transimpedance amplifier which basically serves to generate an output voltage determined by an input current supplied from a photovoltaic device, the value of the output voltage being related to the transimpedance of the read-out amplifying device. While operationally satisfactory, such read-out devices, however, tended to induce deblasting of the detector, which leads to increased noise characteristics. Increased noise, in turn, requires use of relatively high bias voltages for the detector.

One known approach to providing suitable read-out amplifiers for photovoltaic detectors utilizes a series connected autozero capacitor connected between the photovoltaic detector and an integrating amplifier field effect transistor gate. When the known amplifier is reset between read-out integration intervals, noise on the autozero capacitor is held on the photovoltaic detector for the duration of each integration read-out, thereby causing a noise current through the dynamic resistance of the photovoltaic device. This noise current is integrated causing an output noise much larger than the noise voltage initially generated at the autozero capacitor. There is, therefore, seen to be a need for an improved read-out amplifier for a photovoltaic detector which will exhibit improved noise characteristics and minimal debiasing, thereby enabling the photovoltaic detector to operate at relatively small bias voltage levels.

SUMMARY OF THE INVENTION

Accordingly, it is an object of the invention to provide a read-out circuit for a photovoltaic detector which will generate a read-out output voltage proportional to the integral of the photovoltaic detector current generated during a preselected time interval and which will reduce reset noise at the read-out amplifier output.

An infrared photovoltaic detector transimpedance read-out amplifier employs a capacitive feedback amplifier stage which drives a self-calibrating active load. The capacitive feedback is arranged to reduce debiasing of the photovoltaic detector and hence to improve the noise characteristics of the detector by enabling its operation with small bias voltage levels. The self-calibrating active load is configured to reduce the effect of low frequency noise and threshold nonuniformities commonly associated with metal-oxide-silicon field effect transistors (MOSFET).

It is a feature of the invention that any reset noise voltage appearing across the autozero capacitor included in the self-calibrating active load will be substantially reduced at the photovoltaic detector.

It is another feature of this invention that a PMOS field effect transistor driver can be used in place of an NMOS field effect transistor driver in the integrator stage which results in decreased MOSFET noise when the read-out amplifier is utilized with an N-on-P array of photovoltaic devices.

BRIEF DESCRIPTION OF THE DRAWING

These and other objects and features of the invention will become apparent from a reading of a detailed description of a preferred embodiment taken in conjunction with the drawing in which:

FIG. 1 is a circuit schematic showing a prior art autozero capacitvie transimpedance amplifier;

FIG. 2 is a circuit schematic of a capacitive transimpedance read-out amplifier with self-calibrated active load arranged in accordance with the principles of the invention; and FIG. 3 is a timing diagram setting forth the output voltage of the read-out amplifier and the accompanying change in the photovoltaic detector bias voltage during operation of the circuit of FIG. 2.

DETAILED DESCRIPTION

An example of a known read-out circuit for a photovoltaic detector is set forth in FIG. 1. This type of circuit is contemplated by the invention disclosed in co-pending U.S. patent application Ser. No. 682,112, filed Dec. 17, 1984, and assigned to the same assignee as this invention. Autozero capacitance 140 of transimpedance amplifier 100 of FIG. 1 is designed used for applications in which a stable detector bias is desired. Photovoltaic infrared detecting diode 101 has its anode terminal connected to bias source 112 which provides a voltage $V_{COM}$ to the anode terminals of all other photovoltaic diodes in the focal plane array. A cathode electrode of diode 101 is coupled to a first terminal of autozero capacitor $C_{AZ}$ 140, one terminal of feedback capacitor $C_{FB}$ 130 and to a drain electrode of an electronic switch comprised of a MOSFET 102. A terminal 120 of MOSFET 102 is coupled to a substrate bias $V_{SS}$, while the source electrode of MOSFET 102 is coupled to the predetermined bias value for the photovoltaic detector at terminal 110 and designated $V_{DET}$. A gate electrode of MOSFET 102 is coupled at terminal 111 for receipt of a reset signal RST which is additionally coupled to a second electronic switch comprising MOSFET 103 at a gate thereof. A second terminal of autozero capacitor 140 is coupled to a source electrode of MOSFET 103 while a second terminal of the feedback capacitor 130 is coupled to the drain electrode of MOSFET 103. A substrate bias potential $V_{SS}$ is coupled to terminal 113 of MOSFET 103.

An integrating amplifier which uses $C_{FB}$ 130 comprises MOSFET 105 having a gate electrode coupled to the source electrode of MOSFET 103, a bias potential $V_{CAS}$ coupled to a cascode gate of MOSFET 105 at terminal 119, a source electrode 118 coupled to bias source $V_{SS}$ and a drain electrode coupled to the read-out amplifier's output at terminal 117, the output voltage being designated $V_{OUT}$. Also coupled to the output at 117 is the drain electrode of MOSFET 103 and a drain electrode of an active load MOSFET 104. A gate electrode of MOSFET 104 at terminal 114 is coupled to a bias voltage source $V_{LD}$, while the source electrode of MOSFET 104 is coupled at terminal 115 to a bias source $V_{DD}$. A substrate bias source $V_{SUB}$ is coupled to device 104 at terminal 116.

Devices such as shown in FIG. 1 have been used for applications requiring stable detector bias. However, with circuits such as that set forth in FIG. 1, reset noise on the autozero capacitor 140 between the photovoltaic detector 101 and the driver MOSFET 105 at the end of the reset period (when MOSFET switch 102 is turned off) is held on the detector for the entire integration period, causing a current through the detector dynamic resistance which is integrated on the feedback capacitor 130. The noise voltage resulting on the feedback capacitor 130 at the end of the integration interval can be much larger than the reset noise on the autozero capacitor 140 which originally generated the noise signal. Hence, while operating satisfactorily for its intended purpose, the circuit of FIG. 1 requires higher bias voltage levels to provide a good noise margin.

The invention, therefore, as embodied for example in the circuit schematic shown in FIG. 2, is described to improve the performance of such circuits in the presence of noise. As seen from FIG. 2, an anode electrode of photovoltaic infrared detecting diode 201 is coupled to a return source of bias $V_{COM}$ at terminal 210. A cathode electrode of diode 201 is coupled to a source electrode of MOSFET switch 202, to a first terminal of feedback capacitor $C_{FB}$ 230, and a gate electrode of integrator driver amplifier MOSFET 203. The gate electrode 211 of the first MOSFET switch 202 is coupled for receipt of the first resetting enable signal RST1, while the drain electrode of switch 202 is coupled at terminal 212 to the desired bias voltage to be applied during the reset interval to diode 201 designated $V_{DET}$. A substrate bias voltage $V_{SUB}$ is coupled to switch 202 at terminal 213.

The source electrode of integrator driver 203 is coupled at terminal 217 to bias potential $V_{DD}$ while the drain electrode of driver 203 is coupled to a second terminal of feedback capacitor 230, an output terminal of the read-out amplifier 219 (carrying the output voltage designated $V_{OUT}$) and the respective drain electrodes of a second reset switch MOSFET 204 and MOSFET 205 which serves as the principle element of a self-calibrating active load for the read-out amplifier shown. A suitable substrate bias source $V_{SUB}$ is coupled to terminal 218 of MOSFET 203. Driver transistor 203 is of the PMOS type which has lower noise generating characteristics than NMOS type devices.

A gate electrode of second reset switch 204 is coupled at terminal 214 for receipt of a second reset signal RST2. An appropriate substrate bias voltage $V_{SS}$ is coupled to switch 204 at terminal 220, while the source electrode of switch 204 is coupled to a first terminal of autozero capacitor $C_{AZ}$ 240 and to a gate electrode of dynamic load MOSFET 205. A second terminal of autozero capacitor 240 and the source electrode of MOSFET 205 are coupled to bias potential supply $V_{SS}$ at terminal 215.

In the operation of read-out amplifier 200 of FIG. 2, MOSFETs 202 and 204 function simply as on/off electronic switches. These switches are both closed during the reset period of the amplifier and open during the read-out or integration period. During reset, the desired detector bias voltage, $V_{DET}$, appears at the gate of the integrator driver MOSFET 203. This voltage defines the current, $I_{DD}$, through integrator driver MOSFET 203 and active load MOSFET 205. The voltage on the gate of MOSFET 205 becomes the value required to allow $I_{DD}$ to flow through the drain-to-source circuit of load MOSFET 205. Both switches 202 and 204 are open, or in a high impedance state, during the integration. Autozero capacitor 240 maintains the reset voltage of the gate of MOSFET 205 at a level such as to cause MOSFET 205 to continue sinking current $I_{DD}$ established during the reset period. High gain around the feedback loop causes the gate of driver 203 to be held at a voltage such that driver 203 conducts the same amount of current as the active load device 205. Since the current through the active load 205 is the same as that defined by driver 203 during reset, the desired detector bias voltage is held on the gate of MOSFET 203 and the detector diode 201 by the feedback amplifier (driver 203 and feedback capacitor 230). If the open loop gain needs to be increased, a cascode gate 216 or, alternatively, a separate cascode transistor (not shown) can be added to driver MOSFET 203 as shown in FIG. 2 at terminal 216. The cascode gate tends to greatly increase the open loop gain of the integrator driver, because the cascode gate forces a constant voltage across the drain-to-source of the driver MOSFET 203 (analogous to the operation of a transistor source follower), resulting in the zeroing out of the drain-to-source conductance of device 203. Since it can be mathematically shown that the open loop gain is inversely proportional to the drain-to-source conductance of device 203, forcing this term to zero will result in the desired open loop gain increase.

A typical sequence of operation of the circuit of FIG. 2 begins with the closure of the first and second electronic switches 202 and 204 (by a logical low signal appearing at input RST1 and a logical high signal appearing at the gate input of 204 at RST2). The closure or low impedance state of the source-to-drain of switch 202 places the detector bias voltage $V_{DET}$ onto the gate of driver MOSFET 203 resulting in a source to drain current $I_{DD}$. The closure of switch 204 from source-to-drain couples the drain and gate of active load 205 to generate sufficient conduction through load 205 to sink current $I_{DD}$ to bias supply $V_{SS}$ at terminal 215.

Next, the signal RST2 at terminal 214 goes to the logical zero or low state to turn switch 204 off. At this point, the autozero capacitor 240 holds a voltage sufficient to continue sinking $I_{DD}$ through load 205 (a so-called auto-biasing scheme).

Next, RST1 goes high or to logic one to turn off switch 202, thereby initiating the integration period wherein the voltage on the photovoltaic detector 201 will be determined by the capacitive feedback loop of the integrator amplifier. During the integration or read-out period $V_{OUT}$ will go more positive as the current through the photovoltaic detector 201 is integrated. In general, the more light elements or photons impinging upon the detector during the integration interval, the higher the slope of the output voltage of the read-out amplifier. With the circuit as set forth in FIG. 2, it may be shown that the output voltage is directly proportional to the time interval of the current flowing through the photovoltaic detector and inversely proportional to the size of feedback capacitor 230.

It may also be shown with the circuit of FIG. 2 that, during the integration interval, reset noise voltage on capacitor $C_{AZ}$ 240 will appear at the detector diode reduced by the ratio of the transconductance of driver MOSFET 203 to the transconductance of load MOSFET 205. MOSFETs 203 and 205 can easily be scaled such that such ratio is at least 10.

The circuit of FIG. 2 has been simulated in the time domain through use of a computerized circuit analysis program. The pertinent wave forms predicted by the computerized simulation are set forth in FIG. 3 and demonstrate a debiasing or change in the bias voltage applied to the photovoltaic detecting diode of on the order of only 1.5 millivolts.

The invention has been described with reference to a preferred embodiment, the details of which have been set forth for the sake of example only. The invention is to have the scope and be accorded the spirit of the appended claims.

What is claimed is:

1. A read-out amplifier for a photovoltaic detector comprising:
   first switching means coupling, in a low impedance state, a source of bias potential to an output terminal of the photovoltaic detector;
   integrator means having an input coupled to the detector output and an output coupled to an output of the read-out amplifier, the integrator means operative to integrate output current being generated by the photovoltaic detector while the first switching means is in a high impedance state; and
   active load means coupled to the integrator means output, operative to provide a self-calibrated current sink for current output by the integrator means enabling the integrator means to maintain a substantially constant bias potential at the detector while the first switching means is in the high impedance state.

2. The amplifier of claim 1 wherein the integrator means comprises:
   an output driver amplifier for producing an output signal at an output terminal related to a signal presented to an input control terminal and including a feedback capacitor coupled between a driver output and the input control terminal, with the driver output terminal coupled to the integrator means output and the input control terminal coupled to the integrator means input.

3. The amplifier of claim 1 wherein the active load means comprises:
   an active electronic device for presenting an impedance between first and second device output terminals which is variable in accordance with a signal presented to a device input control terminal;
   a feedback capacitor coupled between one of the device output terminals and the input control terminal; and
   a second switching means coupling, in a low impedance state, the other one of the device output terminals to the input control terminal.

4. A read-out amplifier for an infrared detecting photovoltaic detector having a first electrode coupled to a first source of first bias potential and a second electrode coupled to an input of the read-out amplifier comprising:
   a first electronic switch having first and second output terminals and an input terminal, the first output terminal coupled to the read-out amplifier input, the second output terminal coupled to a source of second bias potential, and the input terminal coupled for receipt of a first reset signal, the first switch operative on receipt of the first reset signal to assume a low impedance state between its first and second output terminals;
   a driver amplifier having an input coupled to the read-out amplifier input and including a feedback capacitor coupled between the driver amplifier input and a driver amplifier output which is coupled to a read-out amplifier output, the driver amplifier operative to integrate current generated by the photovoltaic detector over a time interval during which the first reset signal is not present; and
   an active self-calibrating load including variable impedance means having a first output terminal coupled to the driver amplifier output, a second output terminal coupled to a source of third bias potential, and a control input terminal, a second electronic switch having a first output terminal coupled to the first output terminal of the variable impedance means, a second output terminal coupled to the control input terminal of the variable impedance means, and an input terminal coupled for receipt of a second reset signal, the second switch means operative on receipt of the second reset signal to assume a low impedance state between its first and second output terminals, and an autozero feedback capacitor coupled between the control input and second output terminals of the variable impedance means.

5. The read-out amplifier of claim 4 wherein:
   the first electronic switch comprises a first field effect transistor with a source electrode serving as the first output terminal, a drain electrode serving as the second output terminal and a gate electrode serving as the input terminal of the first electronic switch;
   the capacitive driver amplifier includes a second field effect transistor with a source electrode coupled to a fourth bias potential, a gate electrode serving as the driver amplifier input and a drain electrode serving as the driver amplifier output;
   the variable impedance means of the active load comprises a third field effect transistor with a drain electrode serving as the first output terminal, a source electrode serving as the second output terminal, and a gate electrode serving as a control input terminal of the variable impedance means; and
   the second electronic switch comprises a fourth field effect transistor with a drain electrode serving as the first output terminal, a source electrode serving as the second output terminal, and a gate electrode serving as the input terminal of the second electronic switch.

6. The read-out amplifier of claim 5 wherein the first and second field effect transistors comprise metal-oxide-silicon devices (MOSFETs) of PMOS type.

7. The read-out amplifier of claim 5 wherein the third and fourth field effect transistors comprise metal-oxide-silicon devices (MOSFETs) of NMOS type.

8. The read-out amplifier of claim 5 wherein the first, second, third and fourth field effect transistors comprise metal-oxide-silicon devices (MOSFETs).

9. The read-out amplifier of claim 8 wherein the second MOSFET further comprises a cascode gate electrode coupled to a source of fifth bias potential and operative to increase open loop gain of the capacitive driver amplifier.

10. The read-out amplifier of claim 8 wherein the second and third MOSFETs are selected such that the transconductance of the second MOSFET substantially exceeds the transconductance of the third MOSFET.

* * * * *